(12) United States Patent
Yamatsu et al.

(10) Patent No.: US 12,275,839 B2
(45) Date of Patent: Apr. 15, 2025

(54) REINFORCING RESIN COMPOSITION, ELECTRONIC COMPONENT, METHOD FOR MANUFACTURING ELECTRONIC COMPONENT, MOUNTING STRUCTURE, AND METHOD FOR MANUFACTURING MOUNTING STRUCTURE

(71) Applicant: Panasonic Intellectual Property Management Co., Ltd., Osaka (JP)

(72) Inventors: Shigeru Yamatsu, Mie (JP); Yasuhiro Suzuki, Osaka (JP); Hirohisa Hino, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 987 days.

(21) Appl. No.: 17/299,149

(22) PCT Filed: Nov. 28, 2019

(86) PCT No.: PCT/JP2019/046596
§ 371 (c)(1),
(2) Date: Jun. 2, 2021

(87) PCT Pub. No.: WO2020/116313
PCT Pub. Date: Jun. 11, 2020

(65) Prior Publication Data
US 2022/0049085 A1  Feb. 17, 2022

(30) Foreign Application Priority Data
Dec. 3, 2018 (JP) .................. 2018-226757

(51) Int. Cl.
| | | |
|---|---|---|
| *C08L 63/04* | (2006.01) | |
| *C08G 59/24* | (2006.01) | |
| *C08G 59/50* | (2006.01) | |
| *C08G 59/56* | (2006.01) | |
| *C08G 59/62* | (2006.01) | |
| *C08G 59/68* | (2006.01) | |

(Continued)

(52) U.S. Cl.
CPC ............ *C08L 63/04* (2013.01); *C08G 59/245* (2013.01); *C08G 59/5046* (2013.01); *C08G 59/56* (2013.01); *C08G 59/621* (2013.01); *C08G 59/686* (2013.01); *C08L 63/00* (2013.01); *H01L 21/563* (2013.01); *H01L 23/12* (2013.01); *H01L 23/291* (2013.01); *H01L 23/293* (2013.01); *H01L 23/3157* (2013.01); *H01L 24/05* (2013.01); *H01L 24/08* (2013.01); *H01L 24/11* (2013.01); *H01L 24/13* (2013.01); *H01L 24/16* (2013.01); *H01L 24/81* (2013.01); *H05K 3/28* (2013.01); *C08L 2203/206* (2013.01); *C08L 2205/02* (2013.01); *H01L 2224/05568* (2013.01); *H01L 2224/10126* (2013.01); *H01L 2224/10156* (2013.01); *H01L 2224/11013* (2013.01); *H01L 2224/11334* (2013.01); *H01L 2224/11849* (2013.01); *H01L 2224/16058* (2013.01); *H01L 2224/16225* (2013.01); *H01L 2224/16227* (2013.01); *H01L 2224/16238* (2013.01); *H01L 2224/81395* (2013.01); *H01L 2224/81815* (2013.01); *H01L 2224/81862* (2013.01); *H01L 2224/81906* (2013.01); *H01L 2224/81951* (2013.01); *H01L 2924/066* (2013.01); *H01L 2924/0665* (2013.01); *H01L 2924/18161* (2013.01)

(58) Field of Classification Search
CPC .... C08L 63/04; C08L 63/00; C08L 2203/206; C08L 2205/02; H01L 21/563; H01L 23/293; H01L 23/3157; H01L 24/05; H01L 24/08; H01L 2224/16227; H01L 2924/066; H01L 2824/0665; H01L 2924/18161; H01L 24/11; H01L 24/13; H01L 24/16; H01L 24/81; H01L 2224/05568; H01L 2224/10126; H01L 2224/10156; H01L 2224/11013; H01L 2224/11334; H01L 2224/11849; H01L 2224/16058; H01L 2224/16225; H01L 2224/16238; H01L 2224/81395; H01L 2224/81815; H01L 2224/81862; H01L 2224/81906; H01L 2224/81951; H01L 23/12; H01L 23/291; H01L 2924/0665; H05K 3/28; C08G 59/245; C08G 59/5046; C08G 59/621; C08G 59/686; C08G 59/56

See application file for complete search history.

(56) References Cited

U.S. PATENT DOCUMENTS

| | | | |
|---|---|---|---|
| 6,207,786 B1 * | 3/2001 | Ishida ................... | C08L 61/06 528/94 |
| 2016/0152759 A1 | 6/2016 | Tamura et al. | |

(Continued)

FOREIGN PATENT DOCUMENTS

| | | |
|---|---|---|
| JP | 2006-016576 | 1/2006 |
| JP | 2010-254895 | 11/2010 |

(Continued)

OTHER PUBLICATIONS

Official Communication issued in International Patent Application No. PCT/JP2019/046596, dated Feb. 18, 2020, along with an English translation thereof.

*Primary Examiner* — Rabon A Sergent
(74) *Attorney, Agent, or Firm* — GREENBLUM & BERNSTEIN, P.L.C.

(57) ABSTRACT

A reinforcing resin composition includes an epoxy resin (A), a phenolic resin (B), and a benzoxazine compound (C).

8 Claims, 4 Drawing Sheets

(51) Int. Cl.
*C08L 63/00* (2006.01)
*H01L 21/56* (2006.01)
*H01L 23/00* (2006.01)
*H01L 23/12* (2006.01)
*H01L 23/29* (2006.01)
*H01L 23/31* (2006.01)
*H05K 3/28* (2006.01)

(56) References Cited

U.S. PATENT DOCUMENTS

2016/0272764 A1 9/2016 Tamura et al.
2020/0172666 A1 6/2020 Fukuhara et al.

FOREIGN PATENT DOCUMENTS

| WO | 2009/123285 | 10/2009 |
| WO | 2014/156843 | 10/2014 |
| WO | 2014/203735 | 12/2014 |
| WO | 2018/216229 | 11/2018 |

* cited by examiner

REINFORCING RESIN COMPOSITION, ELECTRONIC COMPONENT, METHOD FOR MANUFACTURING ELECTRONIC COMPONENT, MOUNTING STRUCTURE, AND METHOD FOR MANUFACTURING MOUNTING STRUCTURE

CROSS-REFERENCE TO RELATED APPLICATIONS

This application is a National Stage of International Application No. PCT/JP2019/046596 filed Nov. 28, 2019, which claims priority to Japanese Patent Application No. 2018-226757 filed on Dec. 3, 2018, the contents of each noted application is hereby incorporated by reference in its entirety.

TECHNICAL FIELD

The present disclosure generally relates to a reinforcing resin composition, an electronic component, a method for manufacturing the electronic component, a mounting structure, and a method for manufacturing the mounting structure. More particularly, the present disclosure relates to a reinforcing resin composition, an electronic component including a cured product of the reinforcing resin composition and a manufacturing method thereof, and a mounting structure including the cured product of the reinforcing resin composition and a manufacturing method thereof.

BACKGROUND ART

When a semiconductor chip is mounted on a circuit board, a solder bump and a conductor included in the circuit board are electrically connected. When the bump and the conductor are connected, a joint between the bump and the conductor may be covered and reinforced with a cured product of a resin composition. For example, by placing the resin composition between the bump and the conductor and heating the resin composition, the bump will be connected to the conductor, and the joint may be covered with the cured product of the resin composition. An example of such a resin composition that may be used to reinforce the joint is disclosed in Patent Literature 1.

When the bump and the conductor are connected, a contact failure may occur between the bump and the conductor. In particular, the contact failure is likely to occur if the temperature is high at the time of heating.

CITATION LIST

Patent Literature

Patent Literature 1: JP 2010-254895 A

SUMMARY OF INVENTION

It is therefore an object of the present disclosure to provide a reinforcing resin composition that facilitates covering the joint between the conductor and the bump while reducing the chances of causing a contact failure between the bump and the conductor.

A reinforcing resin composition according to an aspect of the present disclosure includes an epoxy resin (A), a phenolic resin (B), and a benzoxazine compound (C).

An electronic component according to another aspect of the present disclosure includes: an electronic component body; a conductor formed on a surface of the electronic component body; a solder bump arranged on the conductor and electrically connected to the conductor; and a reinforcing portion. The reinforcing portion is a cured product of the reinforcing resin composition and covers a joint between the conductor and the bump.

A method for manufacturing the electronic component according to still another aspect of the present disclosure includes curing the reinforcing resin composition after covering a joint between the conductor and the bump with the reinforcing resin composition.

A mounting structure according to yet another aspect of the present disclosure includes: a circuit board including a first conductor; an electronic component including a second conductor; a solder bump; and a reinforcing portion. The bump is interposed between the first conductor and the second conductor and electrically connects the first conductor and the second conductor to each other. The reinforcing portion is a cured product of the reinforcing resin composition and covers at least one of a joint between the first conductor and the bump or a joint between the second conductor and the bump.

A method for manufacturing the mounting structure according to yet another aspect of the present disclosure includes curing the reinforcing resin composition after covering, with the reinforcing resin composition, at least one of a joint between the first conductor and the bump or a joint between the second conductor and the bump.

DESCRIPTION OF EMBODIMENTS

1. Overview

Figure 1:
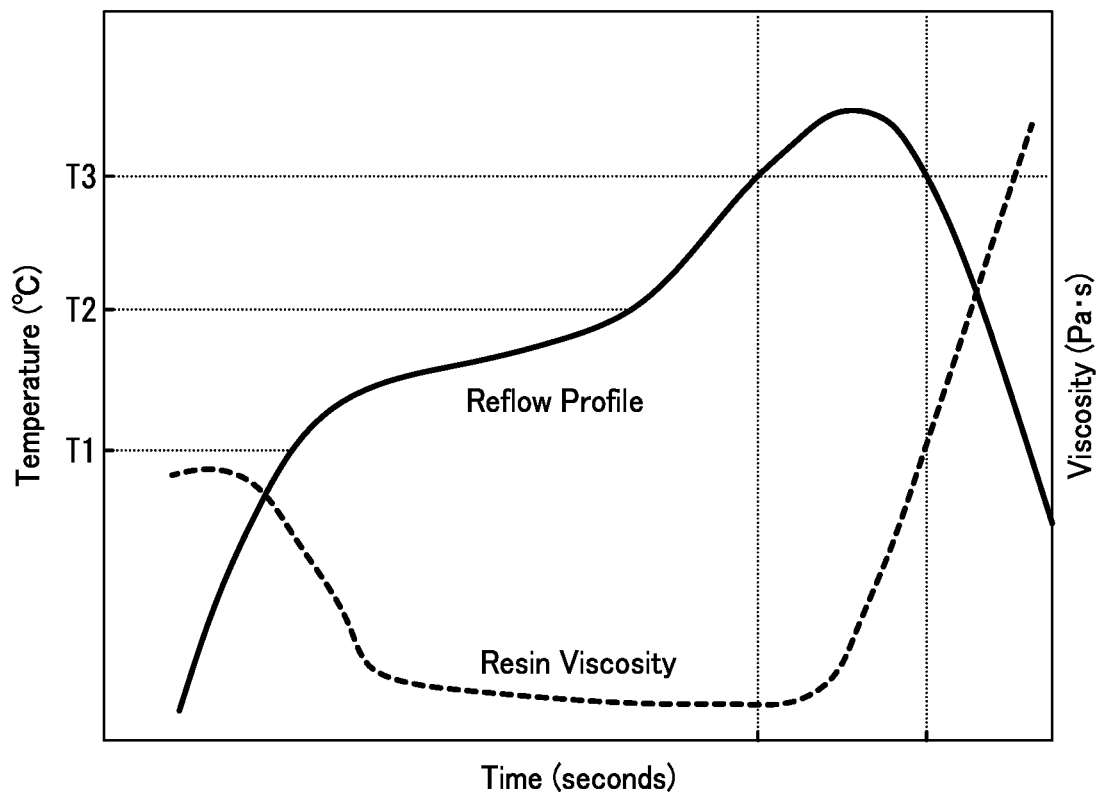
FIG. 1 is a graph showing a reflow profile when a reinforcing resin composition according to an exemplary embodiment of the present disclosure and solder are heated.

A reinforcing resin composition (hereinafter also referred to as a "resin composition (X)") according to an embodiment of the present disclosure includes an epoxy resin (A), a phenolic resin (B), and a benzoxazine compound (C).

If the resin composition (X) is thermally cured by increasing its temperature, the viscosity of the resin composition (X) is easily lowered before the start of a curing reaction of the resin composition (X), and the state of low viscosity is easily maintained even when the temperature increases. In other words, the temperature at which the viscosity of the resin composition (X) starts to rise may be easily increased.

Moreover, if the resin composition (X) is thermally cured by increasing the temperature of the resin composition (X), the curing reaction of the resin composition (X) may be advanced sharply and the viscosity may be increased steeply, once the reaction has started.

Therefore, the conductor and the bump may be easily connected by melting a solder bump before the curing reaction of the resin composition (X) starts. Subsequently, in a state where a joint between the conductor and the bump is covered with the resin composition (X), the resin composition (X) may be rapidly cured, and therefore, the manufacturing efficiency is easily enhanced. This reduces the chances of causing a contact failure between the conductor and the bump even if the bump is made of solder with a high melting point such as SAC solder and the heating temperature is high.

2. Details

Next, a resin composition (X), an electronic component 100 (see FIG. 2), a method for manufacturing the electronic component 100 (see FIGS. 3A-3C), a mounting structure 1 (see FIGS. 4A-4C), and a method for manufacturing the mounting structure 1 (see FIGS. 5A-5C) according to an exemplary embodiment will be described in further detail.

2-1. Resin composition (X)

As described above, the resin composition (X) according to this exemplary embodiment includes an epoxy resin (A), a phenolic resin (B), and a benzoxazine compound (C). Moreover, the resin composition (X) preferably further includes an activator (D). The details of the epoxy resin (A), the phenolic resin (B), the benzoxazine compound (C), and the activator (D) will be described below.

(1) Epoxy Resin (A)

The epoxy resin (A) is a compound having an epoxy group and the property of getting cured by heating. Therefore, the epoxy resin (A) may impart a thermosetting property to the resin composition (X).

The epoxy resin (A) is preferably liquid at a normal temperature. In this case, in the resin composition (X), the epoxy resin (A) and the other components may be mixed more easily. In addition, being liquid at a normal temperature means having fluidity under the atmospheric pressure and at an ambient temperature within the range of 5° C. to 28° C. (particularly around 20° C.). In order for the epoxy resin (A) to be liquid at the normal temperature, only components that are in liquid state at the normal temperature may be included in the epoxy resin (A), or a component that is in liquid state at the normal temperature and a component that is not in liquid state at the normal temperature may be included in the epoxy resin (A), or the epoxy resin (A) may be in liquid state at the normal temperature due to the presence of, for example, a reactive diluent, or a solvent.

The epoxy resins (A) preferably includes a liquid epoxy resins (A1) having two or more epoxy groups in one molecule. The epoxy resin (A1) may contain, for example, one or more components selected from the group consisting of glycidyl ether type epoxy resins, glycidyl amine type epoxy resins, glycidyl ester type epoxy resins, and olefin oxidation type (alicyclic) epoxy resins.

The epoxy resin (A1) may contain, for example, one or more components selected from the group consisting of: bisphenol type epoxy resins such as bisphenol A type epoxy resins and bisphenol F type epoxy resins; hydrogenated bisphenol type epoxy resins such as hydrogenated bisphenol A type epoxy resins and hydrogenated bisphenol F type epoxy resins; biphenyl type epoxy resins; naphthalene ring-containing epoxy resins; alicyclic epoxy resins; dicyclopentadiene type epoxy resins; phenol-novolac type epoxy resins; cresol-novolac type epoxy resins; triphenylmethane type epoxy resins; aliphatic epoxy resins; and triglycidyl isocyanurate.

It is particularly preferable that the epoxy resin (A1) contain one or both of a bisphenol type epoxy resin and a hydrogenated bisphenol type epoxy resin. In this case, it is easier to reduce the viscosity of the resin composition (X) and improve the physical properties of a cured product of the resin composition (X).

A commercially available product may be used as the epoxy resin (A1). Examples of commercially available products include bisphenol A type epoxy resins (such as product number jER828 manufactured by Mitsubishi Chemical Corporation) and bisphenol F type epoxy resins (such as product number jER806 manufactured by Mitsubishi Chemical Corporation).

The epoxy resin (A) may include only the epoxy resin (A1) or may include the epoxy resin (A1) and an epoxy resin other than the epoxy resin (A1).

(2) Phenolic Resin (B)

The phenolic resin (B) is a compound having a phenolic hydroxyl group. This phenolic hydroxyl group may react with the epoxy group of the epoxy resin (A).

The phenolic resin (B) preferably has two or more phenolic hydroxyl groups in one molecule. Examples of the phenolic resin (B) having two or more phenolic hydroxyl groups in one molecule include polyfunctional phenols such as a bisphenol A type, a phenol-novolac type, and a cresol-novolac type. The phenolic resin (B) may contain one or more of these components. The phenolic resin (B) may be a commercially available product. Examples of commercially available phenolic resins include products such as phenol formaldehyde novolac resins (such as product number MEH-8000H manufactured by Meiwa Plastic Industries, Ltd.), phenol-novolac resins (such as product number HF-1M manufactured by Meiwa Plastic Industries, Ltd.), phenol aralkyl resins (such as product number MEH-7800 manufactured by Meiwa Plastic Industries, Ltd.), and biphenyl aralkyl resins (such as product number MEH-7851SS manufactured by Meiwa Plastic Industries, Ltd.).

It is particularly preferable that the phenolic resin (B) include a phenol-novolac resin (B1) having a hydroxyl equivalent of 70 g/eq to 150 g/eq. In this case, the solubility of the phenolic resin (B) with respect to the epoxy resin (A) may be increased. Moreover, in this description, a hydroxyl equivalent refers to a value which is measured by a neutralization titration method compliant with JISK 0070.

It is particularly preferable that the phenol-novolac resin (B1) is in liquid state. In other words, the phenolic resin (B) preferably includes the phenol-novolac resin (B1) having two or more phenolic hydroxyl groups in one molecule, having a hydroxyl equivalent of 70 g/eq to 150 g/eq, and exhibiting liquid state. This may improve the wettability of the resin composition (X). Examples of commercially available products of such a phenol-novolac resin (B1) include a phenol formaldehyde novolac resin (such as product number MEH-8000H manufactured by Meiwa Plastic Industries, Ltd.).

The phenolic resin (B) may include only the phenol-novolac resin (B1) or may include the phenol-novolac resin (B1) and a phenolic resin other than the phenol-novolac resin (B1).

(3) Benzoxazine Compound (C)

The benzoxazine compound (C) is a compound containing a dihydrobenzoxazine ring. The benzoxazine compound (C) has a structure that varies according to the type of its material. The benzoxazine compound (C), for example, may be a synthetic compound of various types of phenols, amines, formaldehydes, and other substances.

Under a normal condition, the polymerization reaction of the benzoxazine compound (C) does not proceed, because the dihydrobenzoxazine ring is chemically stable. However, by heating the benzoxazine compound (C) to about 170° C. or a higher temperature, the dihydrobenzoxazine ring is opened, and a polybenzoxazine compound having a diaminodiphenyl structure composed of a phenolic hydroxyl group and a basic amino group is produced. The basic amino group included in the diaminodiphenyl structure formed by opening the ring may function as a curing accelerator in a reaction between the epoxy resin (A) and the phenolic resin (B) and may accelerate the reaction at a high temperature. In detail, a reaction at a temperature higher than a melting point of SAC solder may be accelerated by the basic amino group. Therefore, the curing action of the resin composition (X) may be accelerated after the melting of the solder starts. Moreover, the dihydrobenzoxazine ring does not open until it reaches 170° C., and therefore, the reaction between the epoxy resin (A) and the phenolic resin (B) does not proceed, and curing of the resin composition (X) may be inhibited before the solder melts. Furthermore, after the dihydrobenzoxazine ring opens, the phenolic hydroxyl group of the phenolic resin (B) may cause self-polymerization without producing a by-product, and may react with the epoxy resin (A). Therefore, after the solder has melted, the resin composition (X) sharply reacts to opening of the dihydrobenzoxazine ring.

The benzoxazine compound (C) preferably includes a polyvalent oxazine compound (C1) having a plurality of oxazine rings in a molecule. The polyvalent oxazine compound (C1) may easily form a three-dimensional cross-linked structure through reaction with the epoxy resin (A). Therefore, the benzoxazine compound (C) including the polyvalent oxazine compound (C1) may increase the glass transition temperature (Tg) of a cured product of the resin composition (X) compared to the benzoxazine compound (C) including no polyvalent oxazine compound (C).

A commercially available product may be used as the polyvalent oxazine compound (C1). An example of a typical commercially available benzoxazine compound (C1) is a P-d-type benzoxazine compound such as: a polymer of a phenol, diaminodiphenylmethane and formaldehyde (manufactured by Shikoku Chemicals Corporation). The P-d-type benzoxazine compound, for example, has the following structure:

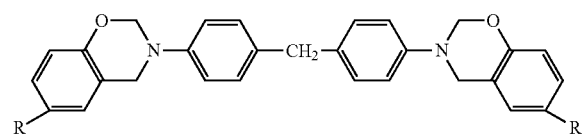

(In this formula, R indicates a hydrogen atom or an allyl group. The allyl group may be an electron withdrawing group or an electron-donating group).

An example of a typical commercially available polyvalent oxazine compound (C1) is an F-a type benzoxazine compound such as: a polymer of a bisphenol F, an aniline, and formaldehyde (manufactured by Shikoku Chemicals Corporation). The F-a type benzoxazine compound has the following structure:

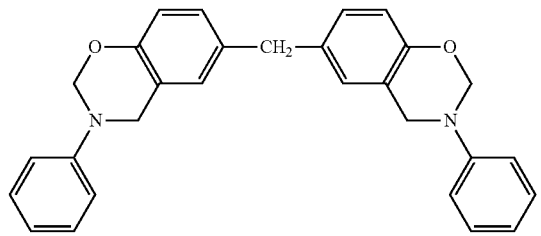 [SMILES: c1ccc(N2COc3ccc(Cc4ccc5c(c4)CN(c4ccccc4)CO5)cc3C2)cc1]

(4) Activator (D)

As described above, the resin composition (X) preferably includes an activator (D). The activator (D) has the function of removing a metal oxide film. Therefore, adding the activator (D) to the resin composition (X) may impart a flux action to the resin composition (X) by. As used herein, the flux action means a reduction action of removing an oxide film formed on the surface of a metal to which solder paste is applied, and the action of lowering a surface tension of the melted solder and improving the wettability of the solder to the joining metal surface.

The activator (D) preferably includes at least one of an organic acid (D1) having a melting point of 130° C. to 220° C. or an amine (D2) having a melting point of 130° C. to 220° C. This allows the activator (D) to decelerate the curing reaction of the epoxy resin (A). Moreover, even when solder having a melting point of around 200° C. or equal to or higher than 200° C. is used, an oxide film of the solder may be removed before the solder is melted. Furthermore, by having the organic acid (D1) or the amine (D2) melted before melting the solder, the viscosity of the resin composition (X) may be lowered before the solder is melted, and the wettability of the resin composition (X) may be improved.

The organic acid (D1) may include, for example, one or more substances selected from the group consisting of a rosin component material, adipic acid, glutaric acid, succinic acid, malonic acid, citric acid, suberic acid (cork acid), sebacic acid, and pimelic acid. The organic acid (D1) preferably includes, among other things, succinic acid (having a melting point of 186° C.), adipic acid (having a melting point of 152° C.), suberic acid (cork acid) (having a melting point of 142° C.), and sebacic acid (having a melting point of 133° C.).

The amine (D2) is not limited to any particular one as long as the amine may be used as a flux, but may include, for example, one or more substances selected from the group consisting of various amine salts, triethanolamine (TEA), and guanidine.

The activator (D) may include components besides the organic acid (D1) and the amine (D2). The activator (D) may include an organic acid or an amine having a melting point below 130° C., or an organic acid or an amine having a melting point above 220° C.

(5) Other Components (E)

The resin composition (X) may include components (E) other than the epoxy resin (A), the phenolic resin (B), the benzoxazine compound (C), and the activator (D). The component (E) may include, for example, a component modifier such as rosin, a filler, and/or a thixophilic imparting agent.

(6) Content of Each Component

In the resin composition (X), the proportion of the epoxy resin (A) with respect to the total of the epoxy resin (A), the phenolic resin (B), the benzoxazine compound (C), and the activator (D) is preferably within a range from 20% by weight to 60% by weight.

Moreover, in the resin composition (X), the proportion of the phenolic resin (B) with respect to the total of the epoxy resin (A), the phenolic resin (B), the benzoxazine compound (C), and the activator (D) is preferably within a range from 10% by weight to 40% by weight.

Moreover, in the resin composition (X), the proportion of the benzoxazine compound (C) with respect to the total of the epoxy resin (A), the phenolic resin (B), the benzoxazine compound (C), and the activator (D) is preferably within a range from 5% by weight to 30% by weight.

Moreover, in the resin composition (X), the proportion of the activator (D) with respect to the total of the epoxy resin (A), the phenolic resin (B), the benzoxazine compound (C), and the activator (D) is preferably within a range from 3% by weight to 40% by weight.

In the resin composition (X), if the proportions of the epoxy resin (A), the phenolic resin (B), the benzoxazine compound (C), and the activator (D) meet the conditions specified above, the glass transition temperature of the cured product of the resin composition (X) may be lowered and the modulus of elasticity of the cured product of the resin composition (X) may be increased. Therefore, the reinforcement effect achieved by covering the periphery of the solder with the cured product of the resin composition (X) may be improved.

In particular, the proportion of the epoxy resin (A) with respect of the total of the epoxy resin (A), the phenolic resin (B), the benzoxazine compound (C), and the activator (D) is preferably 60% by weight or less. This allows the resin composition (X) to rapidly cure and allows the delay in curing of the resin composition (X) to be reduced.

In particular, the proportion of the benzoxazine compound (C) with respect of the total of the epoxy resin (A), the phenolic resin (B), the benzoxazine compound (C), and the activator (D) is preferably 30% by weight or less. This may reduce generation of voids (bubbles) in the cured product of the resin composition (X).

2-2. Reinforcement of Joint Between Conductor and Bump Using Resin Composition (X).

A method for making a reinforcing portion for reinforcing the joint between the conductor and the solder bump by using the resin composition (X) will be described below.

The conductor and the bump may be electrically connected by placing the solder bump on the conductor and melting the bump. The joint between the conductor and the bump may be reinforced by covering the joint between the conductor and the bump with a cured product of the resin composition (X). For example, if the bump and the resin composition (X) are heated in a state where the resin composition (X) is placed between the conductor and the bump, the viscosity of the resin composition (X) decreases, causing the resin composition (X) to flow. Accordingly, the bump comes into contact with the conductor. The bump melts and adheres to the conductor while the resin composition maintains its flowability. The resin composition (X) covers the joint between the conductor and the joint and is cured in that state to make the reinforcing portion. As a result, the conductor and the bump may be electrically connected and the joint between the conductor and the bump may be reinforced by covering it with the reinforcing portion which is the cured product of the resin composition (X). In order to melt the bump, the bump and the resin composition (X) are heated to a temperature higher than the melting point of the solder.

An example of a heating temperature profile and a variation in the viscosity of the resin composition (X) when the conductor and the bump are electrically connected while the reinforcing portion is being made are shown in the graph of FIG. 1. In the graph of FIG. 1, the solid curve indicates the heating temperature, and the dashed curve indicates the viscosity of the resin composition (X). In FIG. 1, T3 (° C.) is the melting point of the bump, and T1 (° C.) and T2 (° C.) are predetermined temperatures which meets the relation: room temperature <T1<T2<T3.

First, as shown in FIG. 1, the heating temperature is raised from room temperature to T1 (° C.). Next, with a temperature increase rate of the heating temperature decreased, the heating temperature is raised to T2 (° C.). Then, with the temperature increase rate increased, the heating temperature is raised to a temperature higher than T3 (° C.) (i.e., raised to a peak temperature). Then, the heating temperature is lowered to room temperature.

The melting point T3 (° C.) of the bump depends on the composition of the solder as a constituent material of the bump. For instance, if the bump is made of a Sn—Ag—Cu (SAC) based solder, T3 (° C.) is, for example, between 217° C.-230° C. T1 (° C.) preferably is defined around the temperature at which the resin composition (X) starts melting. T1 (° C.) may be, but does not have to be, 140° C.-160° C., for example. T2 (° C.) preferably is defined to be higher than T1 (° C.) and lower than the temperature at which the resin composition (X) starts curing. T2 (° C.) may be, but does not have to be, 160° C.-200° C., for example. The peak temperature preferably is defined to be higher than T3 (° C.) and higher than the temperature at which the resin composition (X) starts curing. The peak temperature may be, but does not have to be, 232° C.-255° C., for example. The temperature increase rate of the heating temperature at which the heating temperature rises from room temperature to T1 (° C.) may be, but does not have to be, 5° C./second or less, for example. A period of time it takes for the heating temperature to rise from T1 (° C.) to T2 (° C.) may be, but does not have to be, 60 seconds-100 seconds, for example. The temperature increase rate at which the heating temperature rises from T2 (° C.) to the peak temperature (° C.) may be, but does not have to be, 4° C./second or less, for example. The duration for which the heating temperature remains equal to or higher than T3 (° C.) may be, but does not have to be, 30 seconds to 90 seconds, for example.

As shown in FIG. 1, from around T1 (° C.), the viscosity of the resin composition (X) starts to decrease to cause the resin composition (X) to start flowing. Therefore, the period of time it takes for the resin composition (X) to start flowing since the start of the heating may be controlled by controlling the temperature increase rate of the heating temperature from room temperature to T1 (° C.).

As shown in FIG. 1, even if the heating temperature is raised from T1 (° C.) to T2 (° C.), the resin composition (X) is maintained at a low viscosity. Therefore, the duration for which the resin composition (X) maintains flowability may be controlled by controlling the temperature increase rate from T1 (° C.) to T2 (° C.). This allows the resin composition (X) to flow sufficiently to reduce the chances of causing voids in the reinforcing portion.

As shown in FIG. 1, as the heating temperature rises from T2 (° C.) toward the peak temperature, the viscosity of the resin composition (X) hardly increases, and the state in which the resin composition (X) having flowability is maintained for a while even after the heating temperature exceeds T3 (° C.). Subsequently, the viscosity starts to increase steeply. In other words, even after the heating temperature exceeds the melting point of the solder, the resin composition (X) is allowed to be flowable for a while. Therefore, flowing of the resin composition (X) allows the bump to come into contact with the conductor and to be fused and adhered to the bump easier. Moreover, this reduces the chances of the resin composition (X) inhibiting a self-alignment effect of the melted bump. Furthermore, if the resin composition (X) includes the activator (D), the oxide film of the solder may be quickly removed by the flux action of the activator (D) while the heating temperature rises from T2 (° C.) to T3 (° C.). This allows the conductor and the solder to be connected smoothly and further reduces the chances of causing a contact failure.

Next, the reinforcing portion covering the joint between the conductor and the solder is formed by having the resin composition (X) cured in a state in which the joint between the conductor and the solder is covered with the resin composition (X). As shown in FIG. 1, the viscosity of the resin composition (X) continues increasing even if the heating temperature lowers from the peak temperature towards room temperature. Therefore, the resin composition (X) may be rapidly cured with the joint between the conductor and the bump kept covered with the resin composition (X).

Such viscosity behavior is realized by the resin composition (X) probably because the resin composition (X) includes the epoxy resin (A), the phenolic resin (B), benzoxazine compound (C), and the activator (D).

In detail, the viscosity hardly increases even if the heating temperature rises toward T2 (° C.) from T1 (° C.) during melting of the resin composition (X). This is probably because melting of the benzoxazine compound (C) causes the resin composition (X) to melt. Moreover, even if the heating temperature reaches T3 (° C.), the viscosity of the resin composition (X) does not immediately rise but starts to increase steeply after a while. This is probably because a ring-opening reaction of the benzoxazine compound (C) is caused at a high temperature of 170° C. or higher.

Furthermore, if the resin composition (X) includes the activator (D), the activator (D) preferably includes at least one of an organic acid (D1) or an amine (D2). This allows the activator (D) to decelerate the curing reaction of the epoxy resin (A). This also contributes to keeping the viscosity of the resin composition (X) low until the heating temperature reaches T3 (° C.).

Furthermore, the resin composition (X) cures rapidly even if the heating temperature lowers to room temperature from the peak temperature. This is probably because not only self-polymerization reaction of the benzoxazine compound (C), but a reaction between the benzoxazine compound (C) and the epoxy resin (A) contribute to forming a three-dimensional cross-linked structure. This allows the glass transition temperature (Tg) of the cured product of the resin composition (X) to increase.

Figure 2:
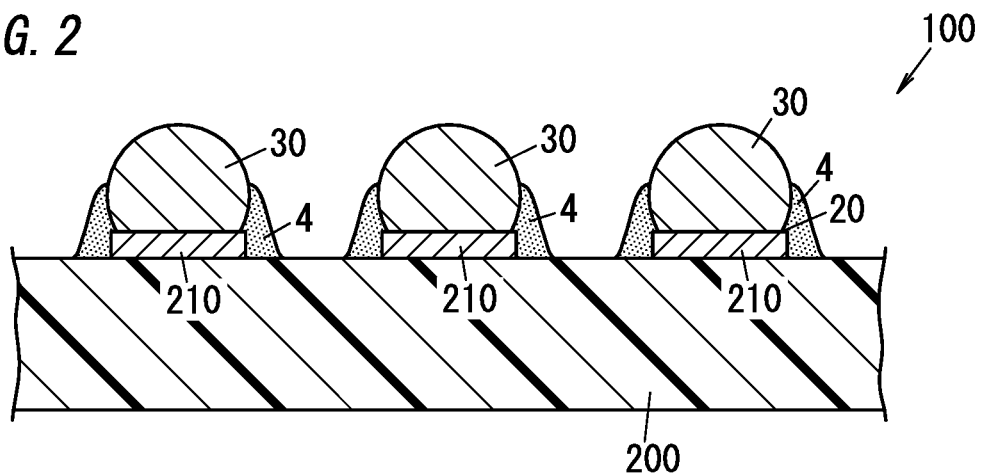
FIG. 2 is a schematic cross-sectional view of an electronic component according to the exemplary embodiment of the present disclosure.

Therefore, applying the resin composition (X) to an electronic component 100 shown in FIG. 2 allows forming a reinforcing portion 4 covering the joint 20 between the conductor 210 included in an electronic component body 200, and a bump 32.

Figure 4A:
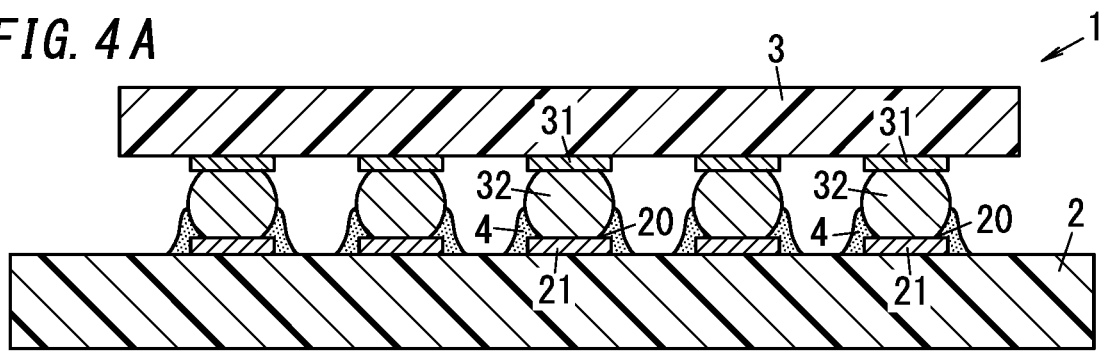
FIGS. 4A-4C are schematic cross-sectional views of exemplary mounting structures according to the exemplary embodiment of the present disclosure.

Furthermore, applying the resin composition (X) to a mounting structure 1 as shown in FIG. 4A allows forming a reinforcing portion 4 covering the joint 20 between a first conductor 21 and a bump 32, when connecting the first conductor 21 of a circuit board 2 and the bump.

In the present embodiment, after the conductor and the bump are electrically connected, the resin composition (X) may be used for forming the reinforcing portion covering the joint between the conductor and the bump.

2-3. Electronic Component and its Manufacturing Method

The configuration of the electronic component 100 to which the resin composition (X) is applied, and a manufacturing method thereof will be described below.

(1) Configuration of Electronic Component

The electronic component 100 of the present embodiment will be described with reference to FIG. 2. Note that the electronic component 100 to be described below is only an example and the configuration of the electronic component 100 should not be construed as limiting.

The electronic component 100 may be, but does not have to be, a surface-mount semiconductor chip, for example. The semiconductor chip may be, but does not have to be, a BGA (a ball-grid array), or a WLP (a wafer level package), for example.

The electronic component 100 includes an electronic component body 200, conductors 210, solder bumps 30, and a reinforcing portion 4.

The conductors 210 are formed on a surface of the electronic component body 200, and therefore, the conductors 210 are exposed to the outside on the surface of the electronic component body 200. If the electronic component 100 is a WLP, the electronic component body 200, for example, includes a silicone substrate with a rewiring layer, and the conductors 210, for example, are pillars electrically connected to the rewiring layer. If the electronic component 100 is a BGA, the electronic component body 200, for example, is a package formed by encapsulating a die (chip) mounted on a substrate with an encapsulation resin, and the conductors 210, for example, are electrode pads electrically connected to the die. The structure of the electronic component body 200 may be modified appropriately according to the type of the electronic component 100 and should not be construed as limiting.

The bumps 30 are arranged on the conductors 210 and electrically connected to the conductors 210. Therefore, the joint 20 is formed between the bumps 30 and the conductors 210. The bumps 30 may be, or do not have to be, made of, for example, SAC solder, or tin-bismuth based (Sn-Bi based) solder. The Sn—Bi based solder may contain, in addition to Sn and Bi, at least one type of material selected from the group consisting of Ag, Ni, Fe, Ge, Cu and In. To improve the mechanical performance of the Sn—Bi based solder, the Sn—Bi based solder preferably contains at least one type of material selected from the group consisting of Ag, Ni, Fe, and Ge.

The reinforcing portions 4 are a cured product of the resin composition (X). In the electronic component 100, the reinforcing portions 4 cover the joint 20 between the bumps 30 and the conductors 210. In other words, in the electronic component 100, the joint 20 between the bumps 30 and the conductors 210 is covered with the cured product of the resin composition (X). Therefore, the reinforcing portions 4 allow reinforcing the joint 20 between the bumps 30 and the conductors 210 and improving the connection reliability of the electronic component 100.

(2) Manufacturing Method of Electronic Component

A manufacturing method of the electronic component 100 will be described with reference to FIGS. 3A-3C.

Figure 3A:
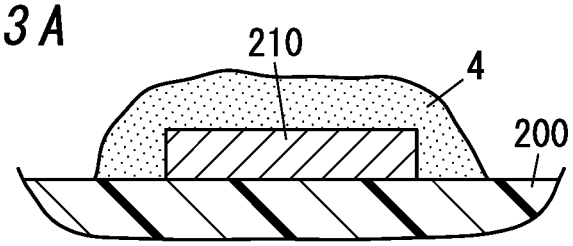
FIGS. 3A-3C are schematic cross-sectional views illustrating an exemplary manufacturing method of the electronic component.

First, an electronic component body 200 including a conductor 210 is provided and the resin composition (X) is arranged to cover the conductor 210 (see FIG. 3A). The arranging method of the resin composition (X) may be, or does not have to be, for example, a printing method such as an inkjet method, or a transfer method.

Figure 3B:
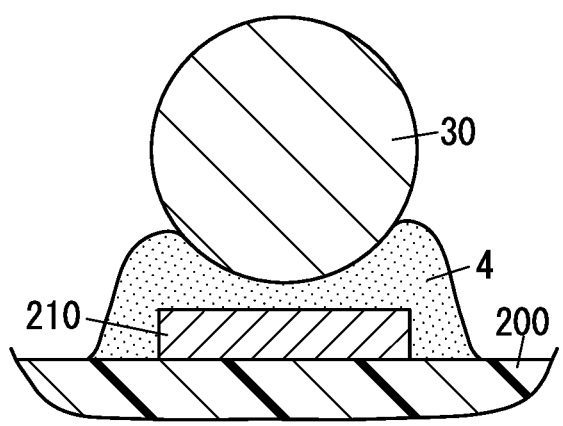
Figure 3C:
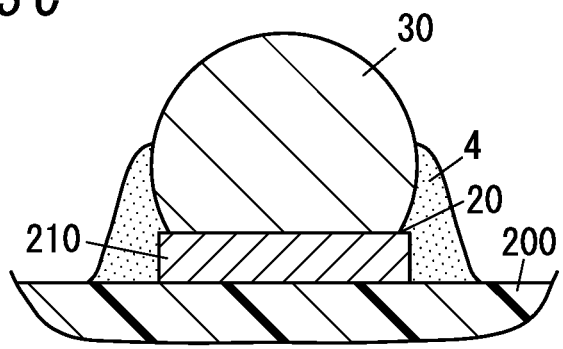

Next, a bump 30 is arranged above the conductor 210 to bring the bump 30 into contact with the resin composition (X) (see FIG. 3B). As for the bump 30, for example, a solder ball may be used.

Next, the bump 30 and the resin composition (X) are heated in a state as shown in FIG. 3B. The heating method may be, but does not have to be, heating with a reflow furnace, for example. In this case, for example, as shown in FIG. 1, the bump 30 and the resin composition (X) may be heated based on the reflow profile as shown in FIG. 1.

As described above in the "2-2. Reinforcement of joint between conductor and bump using resin composition (X)", the resin composition (X) is maintained at a low viscosity until the bump 30 melts. Moreover, even if the bump 30 starts melting, the viscosity of the resin composition (X) does not immediately rise but starts to increase steeply after a while. Therefore, the resin composition (X) may be cured after the joint 20 between the conductor 210 and the bump 30 is covered with the resin composition (X). This allows the conductor 210 and the bump 30 to connect smoothly. In addition, this may reduce the chances of causing a contact failure between the conductor 210 and the bump 30. Furthermore, the joint 20 between the conductor 210 and the bump 30 may be covered with a cured product of the resin composition (X). Therefore, the joint 20 between the conductor 210 and the bump 30 may be reinforced.

2-4. Mounting Structure and its Manufacturing Method (1) Mounting Structure

A mounting structure 1 of the present embodiment will be described with reference to FIGS. 4A-4C. Note that the mounting structure 1 to be described below is only an example and the configuration of the mounting structure 1 should not be construed as limiting.

The mounting structure 1 includes a circuit board 2, an electronic component 3, bumps 32, and reinforcing portions 4.

The circuit board 2 may be a motherboard, a package board, or an interposer board, for example. The circuit board 2 may be, for example, an insulating board made of glass epoxy, polyimide, polyester, a ceramic, or any other suitable material and the first conductor 21 is formed on the surface of the circuit board 2. Thus, the circuit board 2 includes the first conductor 21. The first conductor 21 may be, but does not have to be, conductor wiring.

The electronic component 3 may be a semiconductor chip, for example, and may more specifically be a flip-chip bonded chip such as a ball-grid array (BGA), a land-grid array (LGA), or a chip size package (CSP) chip. Alternatively, the electronic component 3 may also be a package on package (PoP) chip. The second conductor 31 is formed on the surface of the electronic component 3. Thus, the electronic component 3 includes the second conductor 31. The second conductor 31 may be, but does not have to be, electrode pads, for example.

The bumps 32 are interposed between the first conductor 21 of the circuit board 2 and the second conductor 31 of the electronic component 3. The bumps 32 electrically connect the first conductor 21 and the second conductor 31 to each other. The bumps 32 may be, but do not have to be, made of, for example, SAC solder, or tin-bismuth based (Sn—Bi based) solder.

Each of the reinforcing portions 4 is a cured product of the resin composition (X). The reinforcing portion 4 covers each of the joints 20 between the bumps 32 and the first conductor 21 in this mounting structure 1. In other words, in this mounting structure 1, the joints 20 between the bumps 32 and the first conductor 21 are covered with the cured product of the resin composition (X). This allows the reinforcing portions 4 to reinforce the joints 20 between the bumps 32 and the first conductor 21 and thereby improve the connection reliability of the mounting structure 1.

In the mounting structure 1 shown in FIG. 4A, the reinforcing portions 4 cover the joints 20 between the first conductor 21 of the circuit board 2 and the bumps 32, but this configuration is only an example and should not be construed as limiting.

Figure 4B:
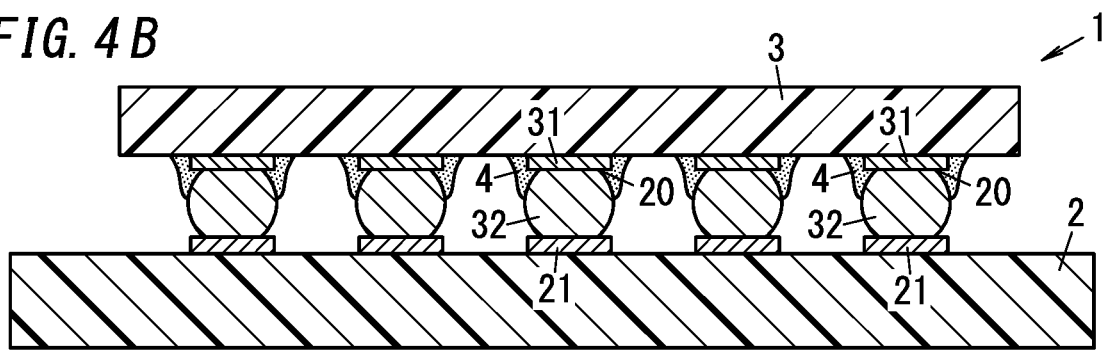

Alternatively, as in the mounting structure 1 as shown in FIG. 4B, for example, each of the joints 20 between the second conductor 31 of the electronic component 3 and the bumps 32 may be covered with the reinforcing portion 4.

Figure 4C:
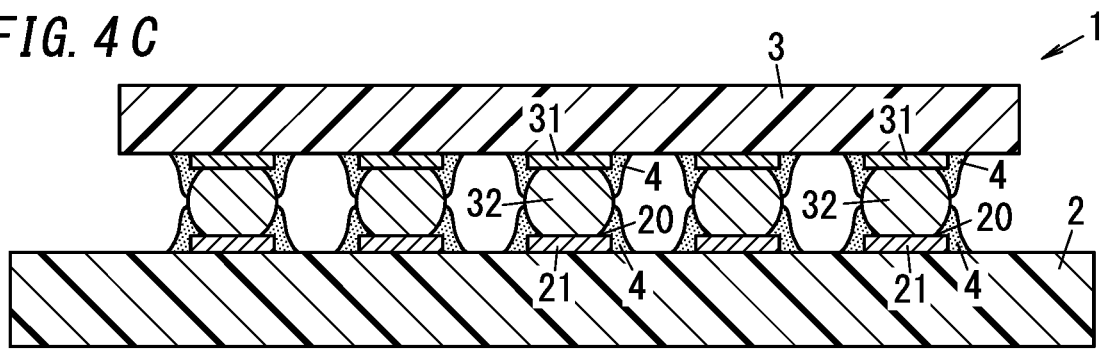

Still alternatively, for example, as in the mounting structure 1 as shown in FIG. 4C, each of the joints 20 between the first conductor 21 of the circuit board 2 and the bumps 32 may be covered with the reinforcing portion 4, and each of the joints 20 between the second conductor 31 of the electronic component 3 and the bump 32 may be covered with the reinforcing portion 4.

Yet alternatively, if an interval between adjacent parts of the first conductor 21 is short (narrow pitch) in the mounting structure 1 shown in the FIGS. 4A and 4C, or if an interval between adjacent parts of the second conductor 31 is short in the mounting structure 1 shown in FIGS. 4B and 4C, those adjacent parts of the reinforcing portions 4 may be connected and unified. Optionally, in the mounting structures 1 shown in the FIGS. 4A-4C, all adjacent reinforcing portions 4 may be connected. In other words, the surface of the circuit board 2 may be covered with the reinforcing portion 4, and the surface of the electronic component 3 may be covered with the reinforcing portion 4.

Furthermore, in the mounting structure 1 shown in FIG. 4C, each of the reinforcing portions 4 covering the joints 20 between the first conductor 21 and the bumps 32 and an associated one of the reinforcing portion 4 covering the joints 20 between the second conductor 31 and the bumps 32 may be connected and unified. However, if the bumps 32 are heated a plurality of times at a temperature equal to or higher than the melting point of the solder as a constituent material for the bumps 32 (for example, reflow process and repair process), an internal pressure may increase at the time of remelting of the solder, and a solder flash may occur. Therefore, the reinforcing portions 4 covering the joints 20 between the first conductor 21 and the bumps 32 and the reinforcing portions 4 covering the joints 20 between the second conductor 31 and the bumps 32 preferably should not be unified.

(2) Manufacturing Method of Mounting Structure

A manufacturing method of the mounting structure 1 shown in FIG. 4A will be described with reference to FIGS. 5A-5C.

Figure 5A:
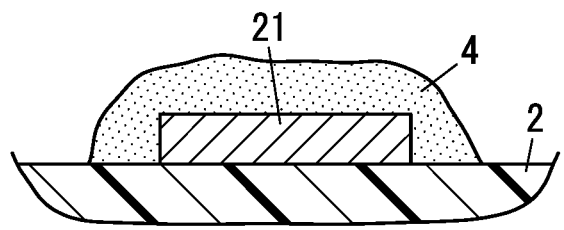
FIGS. 5A-5C are schematic cross-sectional views illustrating an exemplary manufacturing method of the mounting structure.

First, a circuit board 2 including a first conductor 21 is provided and the resin composition (X) is arranged to cover the first conductor 21 (see FIG. 5A). The arranging method of the resin composition (X) may be, or does not have to be, for example, a printing method, a transfer method, or an application method.

Next, an electronic component 3 including a second conductor 31 is provided. The bump 32 is provided on the second conductor 31, and the second conductor 31 and the bump 32 are electrically connected. The electronic component 3 is arranged on the circuit board 2 to bring the bump 32 into contact with the resin composition (X) (see FIG. 5B).

Figure 5B:
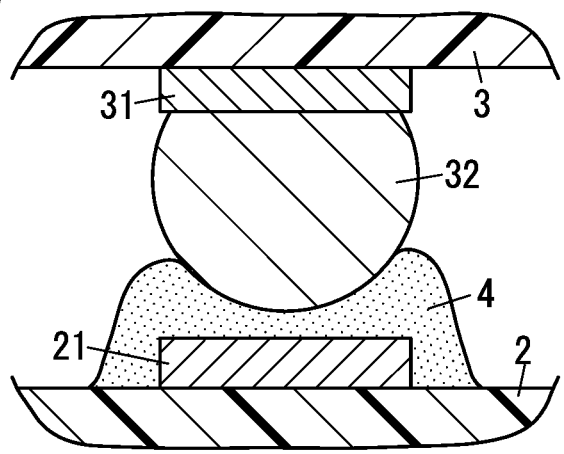
Figure 5C:
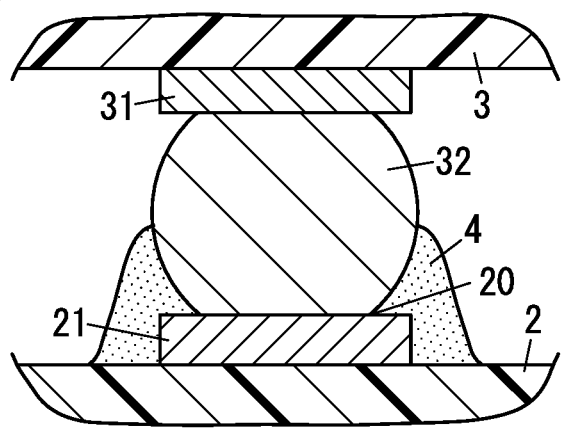

Next, the bump 32 and the resin composition (X) are heated in a state as shown in FIG. 5B. The heating method may be, but does not have to be, heating with a reflow furnace, for example. In this case, for example, the bump 32 and the resin composition (X) may be heated based on the reflow profile shown in FIG. 1.

As described above in the "2-2. Reinforcement of joint between conductor and bump using resin composition (X)", the resin composition (X) is maintained at a low viscosity until the bump 32 melts. Moreover, even if the bump 32 starts melting, the viscosity of the resin composition (X) does not immediately rise but starts to increase steeply after a while. Therefore, the resin composition (X) may be cured after the joint 20 between the first conductor 21 and the bump 32 is covered with the resin composition (X). This allows the first conductor 21 and the bump 32 to connect smoothly. In addition, this may reduce the chances of causing a contact failure between the first conductor 21 and the bump 32. Furthermore, the joint 20 between the first conductor 21 and the bump 32 may be covered with a cured product of the resin composition (X). Therefore, the joint 20 between the first conductor 21 and the bump 32 may be reinforced.

In the manufacturing method of the mounting structure 1 described above, the bump 32 is arranged on the second conductor 31, but this configuration is only an example and should not be construed as limiting. Alternatively, for example, the bump 32 may be arranged on the first conductor 21. In this case, the resin composition (X) is arranged to cover the second conductor 31, and when the second conductor 31 and the bump 32 are connected, the resin composition (X) may be cured after the joint 20 between the second conductor 31 and the bump 32 has been covered with the resin composition (X). In this case, as in the mounting structure 1 shown in FIG. 4B, the joint 20 between the second conductor 31 and the bump 32 may be reinforced by the reinforcing portion 4.

EXAMPLES

1. Preparation of Resin Composition

A resin composition was obtained by mixing the components shown in Tables 1 and 2 in the proportions shown in Tables 1 and 2. The details of the components shown in Table 1 are as follows:

EPICLON 835LV: Bisphenol F type epoxy resin in liquid state at 25° C., an epoxy equivalent of 160-170, viscosity of 2000-2500 mPa·s at 25° C.; product name EPICLON 835LV, manufactured by DIC Corporation.

MEH8000H: Phenolic resin in liquid state at 25° C., viscosity of 1500-3500 mPa·s at 25° C.; product number MEH-8000H, manufactured by Meiwa Plastic Industries, Ltd.

P-d: p-d type benzoxazine compound, manufactured by SHIKOKU CHEMICALS CORPORATION.

2P4MHZ: 2-phenyl-4-hydroxymethyl-5-methylimidazole, product number 2P4MHZ-PW, manufactured by SHIKOKU CHEMICALS CORPORATION.

Adipic acid: adipic acid, melting point of 152-155° C., manufactured by Tokyo Chemical Industry Co., Ltd.

Succinic acid: succinic acid, melting point of 185-189° C., manufactured by Tokyo Chemical Industry Co., Ltd.

TEA: triethanolamine, melting point of 199° C., manufactured by Tokyo Chemical Industry Co., Ltd.

Guanidine: Guanidine hydrochloride, melting point of 185-189° C., manufactured by Tokyo Chemical Industry Co., Ltd.

2. Evaluation (1) Curability

The gel times at 240° C. of the resin compositions of Examples 1-10 and Comparative Examples 1-6 were measured. A rheometer (DISCOVERY HR-2) manufactured by TA Instruments was used for the gel time measurement. The gel time is a period of time it takes for the storage modulus and loss modulus of the resin composition (X) to match. In addition, the resin compositions were graded by gel time based on the following criteria. The results are shown in the following Tables 1 and 2.

Grade A: when the gel time was 120 seconds or more and less than 600 seconds (when curability thereof was particularly good);

Grade B: when the gel time was 60 seconds or more and less than 120 seconds (when curability thereof was good); and Grade C: when the gel time was less than 60 seconds or 600 seconds or more (when the resin composition had some curability).

(2) Wettability

Using the resin compositions of Examples 1-10 and Comparative Examples 1-6, a film having a thickness of 0.1 mm was formed on a copper plate. SAC 305 solder having a melting point of 222° C. was shaped into a sphere having a diameter of 0.35 mm, and this SAC 305 solder was placed on the film Next, the plate including the film and the SAC 305 was heated at 240° C. for three minutes and then cooled to room temperature. Next, the diameter (D) and the height dimension (H) of the SAC 305 solder in a plan view were checked, and based on the result, a value was calculated by the formula $\{(D-H)/D\} \times 100(\%)$. This value was used as an index to wettability. The resin compositions were graded by this value based on the following criteria. The results are shown in the following Tables 1 and 2.

Grade A: when the value was 55% or more (when solder wettability thereof was particularly good);

Grade B: when the value was 40% or more and less than 55% (when solder wettability thereof was good); and Grade C: when the value was less than 40% (when the resin composition had some solder wettability).

(3) Void

Cured products were formed from the resin compositions of Examples 1-10 and Comparative Examples 1-6. In detail, a U-shaped piece of silicone rubber with a thickness of 0.5 mm was attached to a copper plate (2.5 cm×2.5 cm) and each of the resin compositions was poured inside the piece of silicone rubber. Moreover, a slide glass plate(2.5 cm×2 cm, 1 mm thick) was placed on top of the piece of silicon rubber and secured with a clip to prevent leakage of the resin composition. Next, a cured product having a thickness of 0.5 mm and a size of 2.0 cm×2.0 cm was formed by having the resin compositions heated for 20 minutes in a curing oven at 240° C. and cured. The voids (air bubbles) in the cured product were observed, and the resin compositions were graded by the number of voids based on the following criteria. The results are shown in the following Tables 1 and 2.

Grade A: when the number of voids was less than 10;

Grade B: when the number of voids was 10 or more and less than 30; and

Grade C: when the number of voids was more than 30.

(4) Total Evaluation

Each of the resin compositions was graded based on the evaluation results of curability, wettability, and voids. The results are shown in the following Tables 1 and 2.

Grade A: when the resin composition was graded A in terms of all of curability, wettability, and voids;
Grade B: when the resin composition was graded B in one or more of curability, wettability, or voids and was not graded C in any of the three evaluation items; and
Grade C: when the resin composition was graded C in one or more of curability, wettability, or voids.

TABLE 1

| | | | Ex. 1 | Ex. 2 | Ex. 3 | Ex. 4 | Ex. 5 | Ex. 6 | Ex. 7 | Ex. 8 |
|---|---|---|---|---|---|---|---|---|---|---|
| Composition (parts by weight) | Epoxy | EPICLON 835LV | 20 | 60 | 40 | 22.5 | 50 | 50 | 40 | 50 |
| | Phenolic | MEH8000H | 35 | 15 | 10 | 45 | 35 | 30 | 20 | 30 |
| | Benzoxazine | P-d | 35 | 15 | 40 | 22.5 | 5 | 10 | 30 | 10 |
| | Imidazole | 2P4MHZ | — | — | — | — | — | — | — | — |
| | Activator | Adipic acid | 10 | 10 | 10 | 10 | 10 | 10 | 10 | — |
| | | Succinic acid | — | — | — | — | — | — | — | — |
| | | TEA | — | — | — | — | — | — | — | — |
| | | Guanidine | — | — | — | — | — | — | — | — |
| Evaluation | Curability | 240° C. gel time | A | A | A | A | A | A | A | A |
| | Wettability | Wet spread rate | A | A | A | A | A | A | A | A |
| | | Voids | A | A | B | A | A | A | A | A |
| | | Total Grade | A | A | B | A | A | A | A | A |

TABLE 2

| | | | Ex. 9 | Ex. 10 | Cmp. Ex. 1 | Cmp. Ex. 2 | Cmp. Ex. 3 | Cmp. Ex. 4 | Cmp. Ex. 5 | Cmp. Ex. 6 |
|---|---|---|---|---|---|---|---|---|---|---|
| Composition (parts by weight) | Epoxy | EPICLON835LV | 50 | 50 | 50 | 50 | 22.5 | 70 | 15 | 50 |
| | Phenolic | MEH8000H | 30 | 30 | 25 | 40 | 22.5 | 10 | 50 | 35 |
| | Benzoxazine | P-d | 10 | 10 | 25 | — | 45 | 10 | 25 | — |
| | Imidazole | 2P4MHZ | — | — | — | — | — | — | — | 3 |
| | Activator | Adipic acid | — | — | — | 10 | 10 | 10 | 10 | 12 |
| | | Succinic acid | — | — | — | — | — | — | — | — |
| | | TEA | 10 | — | — | — | — | — | — | — |
| | | Guanidine | — | 10 | — | — | — | — | — | — |
| Evaluation | Curability | 240° C. gel time | A | A | A | C | B | C | C | C |
| | Wettability | Wet spread rate | A | A | C | A | B | A | C | C |
| | | Voids | A | A | A | A | C | A | A | C |
| | | Total Grade | A | A | C | C | C | C | C | C |

REFERENCE SIGNS LIST

1 Mounting Structure
2 Circuit Board
3 Electronic Component
20 Joint
21 First Conductor
30, 32 Bump
31 Second Conductor
100 Electronic Component
200 Electronic Component Body
210 Conductor

The invention claimed is:

1. A reinforcing resin composition comprising:
an epoxy resin (A);
a phenolic resin (B); and
a benzoxazine compound (C); and
an activator (D),
wherein with respect to a total of the epoxy resin (A), the phenolic resin (B), the benzoxazine compound (C), and the activator (D):
proportion of the epoxy resin (A) is within a range from 20% by weight to 60% by weight;
proportion of the phenolic resin (B) is within a range from 10% by weight to 40% by weight;
proportion of the benzoxazine compound (C) is within a range from 5% by weight to 30% by weight; and
proportion of the activator (D) is within a range from 10% by weight to 40% by weight.

2. The reinforcing resin composition of claim 1, wherein the activator (D) comprises at least one of an organic acid (D1) having a melting point of 130° C. to 220° C., and an amine (D2) having a melting point of 130° C. to 220° C.

3. The reinforcing resin composition of claim 1, wherein the phenolic resin (B) comprises a phenol-novolac resin (B1) having a hydroxyl equivalent of 70 g/eq to 150 g/eq.

4. The reinforcing resin composition of claim 1, wherein the benzoxazine compound (C) comprises a polyvalent oxazine compound (C1) having a plurality of oxazine rings in one molecule.

5. An electronic component comprising:
an electronic component body;
a conductor formed on a surface of the electronic component body;
a solder bump arranged on the conductor and electrically connected to the conductor; and
a reinforcing portion that is a cured product of the reinforcing resin composition according to claim 1 and covers a joint between the conductor and the solder bump.

6. A method for manufacturing the electronic component of claim 5, the method comprising:
curing the reinforcing resin composition after covering the joint between the conductor and the bump with the reinforcing resin composition.

7. A mounting structure comprising:
a circuit board including a first conductor;
an electronic component including a second conductor;
a solder bump interposed between the first conductor and the second conductor and electrically connecting the first conductor and the second conductor to each other; and
a reinforcing portion that is a cured product of the reinforcing resin composition according to claim 1 and covers at least one of a joint between the first conductor and the bump or a joint between the second conductor and the bump.

8. A method for manufacturing the mounting structure of claim 7, the method comprising:
curing the reinforcing resin composition after covering, with the reinforcing resin composition, at least one of the joint between the first conductor and the bump or the joint between the second conductor and the bump.

\* \* \* \* \*